United States Patent [19]

Monticelli

[11] Patent Number: 4,835,489
[45] Date of Patent: May 30, 1989

[54] SINGLE-ENDED, FEED-FORWARD GAIN STAGE

[75] Inventor: Dennis M. Monticelli, Fremont, Calif.

[73] Assignee: National Semiconductor Corporation, Santa Clara, Calif.

[21] Appl. No.: 214,899

[22] Filed: Jun. 29, 1988

Related U.S. Application Data

[63] Continuation of Ser. No. 14,489, Feb. 13, 1987, abandoned.

[51] Int. Cl.$^4$ ............................................... H03F 3/16
[52] U.S. Cl. .................................. 330/277; 330/151; 330/288; 330/300
[58] Field of Search ............... 330/125, 151, 253, 277, 330/288, 300

[56] References Cited

U.S. PATENT DOCUMENTS

| | | | |
|---|---|---|---|
| 3,408,586 | 10/1968 | Ordower | 330/151 X |
| 3,533,004 | 10/1970 | Embley | 330/125 X |
| 4,405,900 | 9/1983 | van de Plassche | 330/151 |
| 4,525,688 | 6/1985 | Murphy et al. | 330/125 X |

Primary Examiner—James B. Mullins
Attorney, Agent, or Firm—Limbach, Limbach & Sutton

[57] ABSTRACT

In a non-inverting gain stage of the type that receives a single input and generates a single-ended output, the improvement comprising a feed-forward path which provides the input to the output when the supply is above a preselected frequency. The stage is capable of operation down to very low supply voltage (1V) and features rail-to-rail ouput swing.

12 Claims, 5 Drawing Sheets

SINGLE-ENDED, FEED-FORWARD GAIN STAGE

This is a continuation of co-pending application Ser. No. 014,489 filed on Feb. 13, 1987, and now abandoned.

BACKGROUND OF THE INVENTION

1. Field of the Invention

The present invention relates to operational amplifiers and, in particular, to a non-inverting gain stage which receives a single input and generates a single-ended output and which provides increased low frequency gain without introducing high frequency instability.

2. Discussion of the Prior Art

A high gain operational amplifier usually consists of the basic stages shown in FIG. 1. The external input to the amplifier is typically a differential voltage i.e., the difference that exists between the individual voltages applied to two input pins $V_{IN}(+)$ and $V_{IN}(-)$. The overall output of the amplifier is the voltage that is available at the output $V_{out}$. The output voltage is referred to as a single-ended because, although the input is a differential signal, only one output voltage exists.

The input stage provides high voltage gain to the differential signal applied between its inputs while responding with much lower gain to voltages common to the two inputs. As a result, the differential signal is amplified with little effect from extraneous common-mode signals resulting from, for example, noise pick up. Thus, the input stage of an operational amplifier is designed to minimize errors of the overall amplifier by controlling the error sources at this stage and by developing high gain which reduces the impact of errors introduced in subsequent stages. The input state also provides isolation of input and output quiescent voltage levels by means of its common-mode signal characteristics.

The intermediate stages of an operational amplifier develop additional voltage gain and provide current gain from the input stage to the output stage. Frequently, the major portion of the amplifier's total voltage gain is developed in these intermediate stages. Current gain in these stages provides high current to the output stage without heavy loading of the input stage.

Both differential and single input formats may be used for the intermediate stages. Unless a differential output is desired from the overall amplifier, it is common to use single-ended intermediate gain stages. The choice between the two types is based in part upon power supply rejection ratio, balanced input stage loading, level shifting needs and other factors. As in the input stage, common-mode rejection is developed by the high differential gain and low common-mode gain of a differential stage. However, continued addition of differential rather than single-ended stages results in complexity without benefit. Typically, only one high gain differential gain stage is used.

FIG. 1 shows an operational amplifier with one differential input intermediate gain stage and one single input intermediate gain stage. The first stage is a non-inverting stage with gain A1 and includes a local feed-forward compensation capacitor $C_F$; the second stage is an inverting stage with gain A2. Note that one of the inputs of the differential stage must be bypassed by signal passage by capacitor $C_B$. FIG. 1 also shows a capacitor $C_c$ that maintains the frequency stability of the overall amplifier in a conventional manner by providing conversion of the single-ended output current from the input stage to the output voltage of the intermediate gain stages.

The output stage of an operational amplifier provides impedance isolation from loads by presenting high input impedance to the proceeding intermediate stage and low output impedance to the load. To provide isolation without degrading high frequency performance, the output stage is generally designed to have low input capacitance and wide bandwidth.

FIG. 2 shows a simplified bipolar operational amplifier design of the high gain variety which is known in the prior art. The input differential amplifier stage consists of two common-emitter amplifier transistors Q1 and Q2 which convert the differential voltage applied at the two inputs $V_{IN}(+)$ and $V_{IN}(-)$ to differential voltages $V_{Q1}$ and $V_{Q2}$ at the collectors of devices Q1 and Q2, respectively. Voltage $V_{Q2}$ is bypassed at high frequencies by capacitor $C_B$. Voltage $V_{Q1}$ is applied to the inputs of a differential intermediate gain stage which consists of devices Q3, Q4, Q5 and Q6 and a current mirror which consists of devices Q7 and Q8. This stage provides additional voltage gain at low frequencies, the higher frequencies being fed forward around the intermediate circuitry by feed-forward capacitor $C_F$. It is necessary for stability that the drive to this stage, as supplied by the input stage, be essentially single-ended at high frequency; hence the need for bypass capacitor $C_B$. Capacitor $C_B$ is often large in value and difficult to integrate on a chip. Its action discards 6dB of high frequency voltage gain.

Thus, the prior art has limitations when applied to low voltage designs and the level of circuit complexity is too great for use in cost-effective, multiple-amplifier-on-a-chip products.

SUMMARY OF THE INVENTION

It is an object of the present invention to provide a single input gain stage with rail-to-rail output swing.

It is an object of the present invention to provide a single input CMOS gain stage that operates on low voltage.

It is a further object of the invention to provide a feed-forward gain stage that does not require an additional compensation capacitor for input signal bypassing.

These and other objects of the invention are accomplished by providing a single-input, single-ended, feed-forward gain stage which includes means for feeding the input signal forward to a high impedance node at the output at high frequency. The frequency at which this occurs is set to be lower than the unity gain frequency of the overall amplifier of which the gain stage is a part.

The ground referred input of the gain stage is a simple interface to low voltage circuitry, while the rail-to-rail output swing makes maximum use of low supplies.

Other objects, features and advantages of the present invention will become apparent and be appreciated by referring to the detailed description provided below which is to be considered in conjunction with the accompanying drawings.

DETAILED DESCRIPTION OF THE INVENTION

Figure 1:
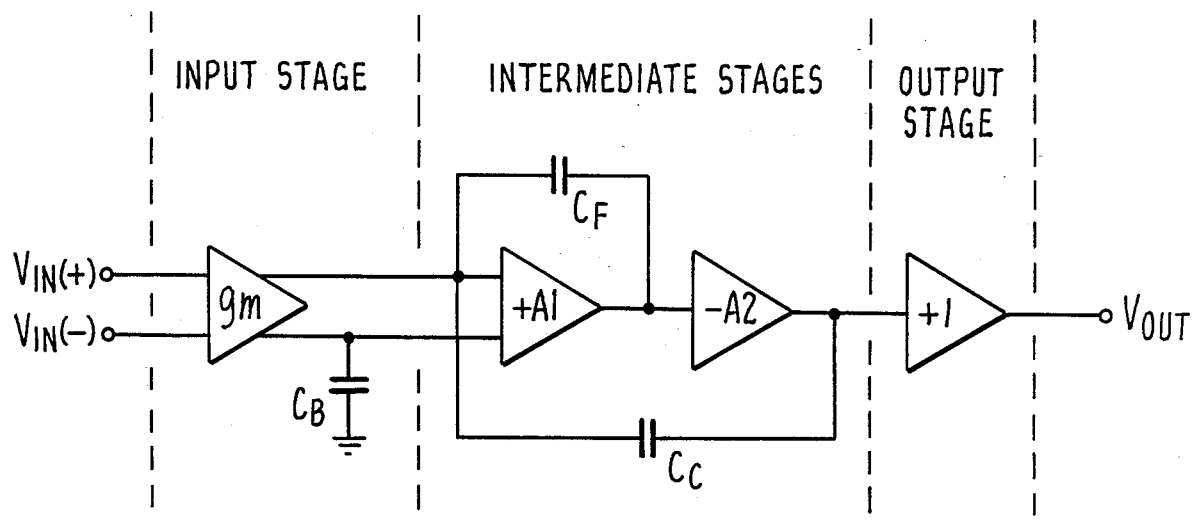
FIG. 1 is a block diagram illustrating a prior art application of a feed-forward gain stage (A1) in a high gain operational amplifier.
Figure 2:
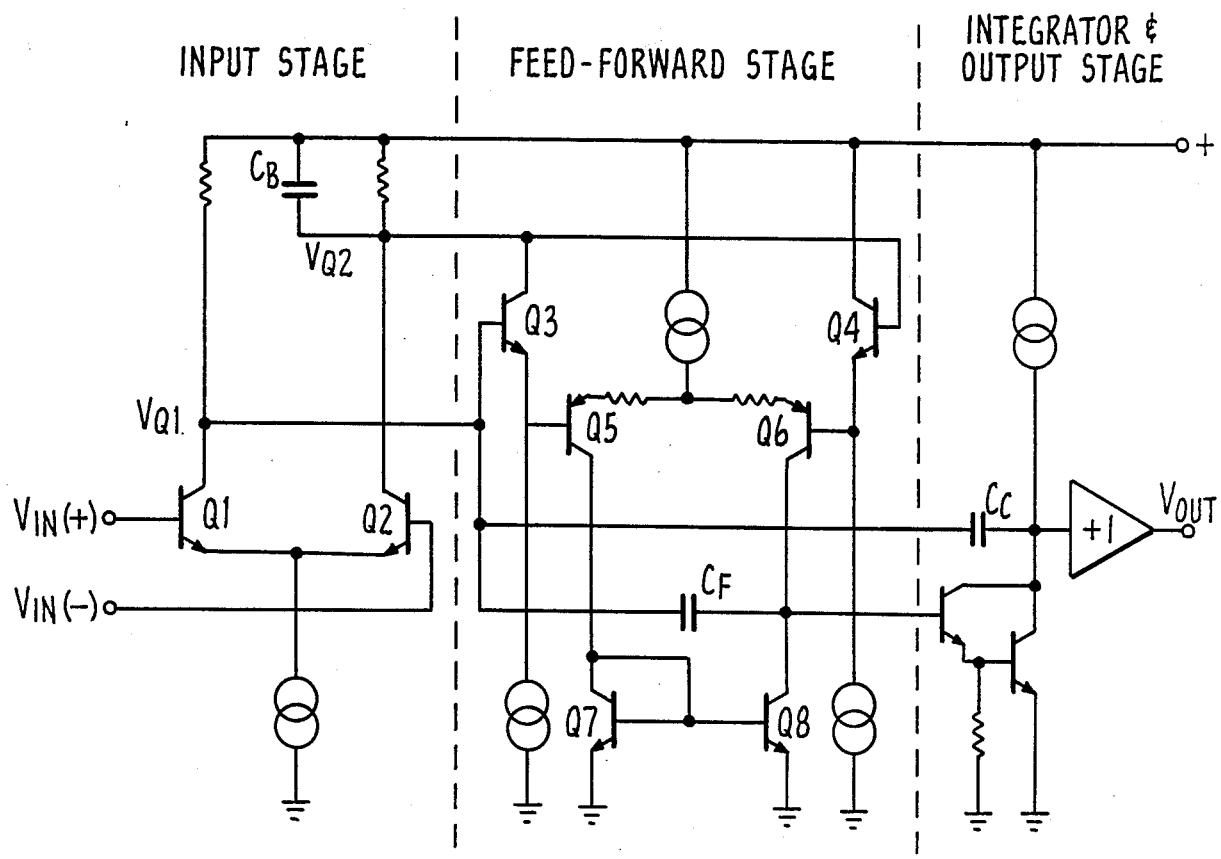
FIG. 2 is a schematic diagram illustrating a prior art differential feed-forward stage in a bipolar operational amplifier.
Figure 3:
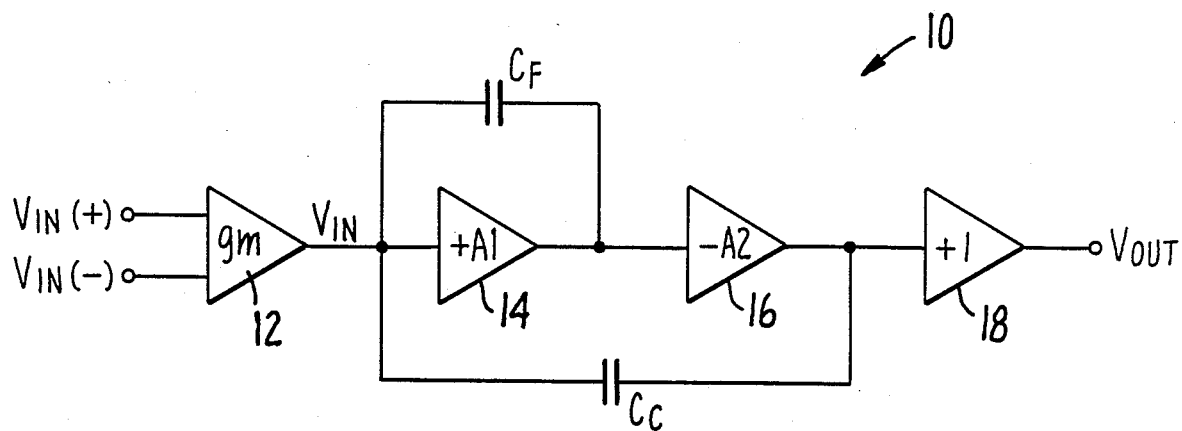
FIG. 3 is a block diagram illustrating a basic application of the gain stage of the present invention.

A basic application of the present invention is illustrated in FIG. 3. FIG. 3 shows an operational amplifier 10 which includes a differential input stage 12 which provides high voltage gain to differential inputs $V_{IN}(+)$ and $V_{IN}(-)$ to generate a single-ended input $V_{IN}$ to non-inverting, single-ended gain stage 14 having gain of $+A1$. The output of gain stage 14 is provided to an inverting gain stage 16 having gain $-A2$. The output of gain stage 16 is provided to a unity gain output stage 18 which generates output signal $V_{OUT}$. A feed-back path from the input of the non-inverting gain stage 14 to the output of the inverting gain stage 16 is provided through capacitor $C_c$ to provide frequency compensation around the intermediate gain stages 14 and 16 in the conventional manner. Thus, the operational amplifier illustrated in FIG. 3 is similar in design to the conventional operational amplifier illustrated in FIG. 1. The primary difference is that the prior art differential approach requires an additional and large compensation capacitor $C_B$ to insure that the input stage drives the feed-forward stage in a single-ended fashion at high frequencies. This is necessary to maintain frequency stability. In addition, the differential approach is more complex than the concept of the present invention and not as amenable to low supply voltage operation.

Figure 4:
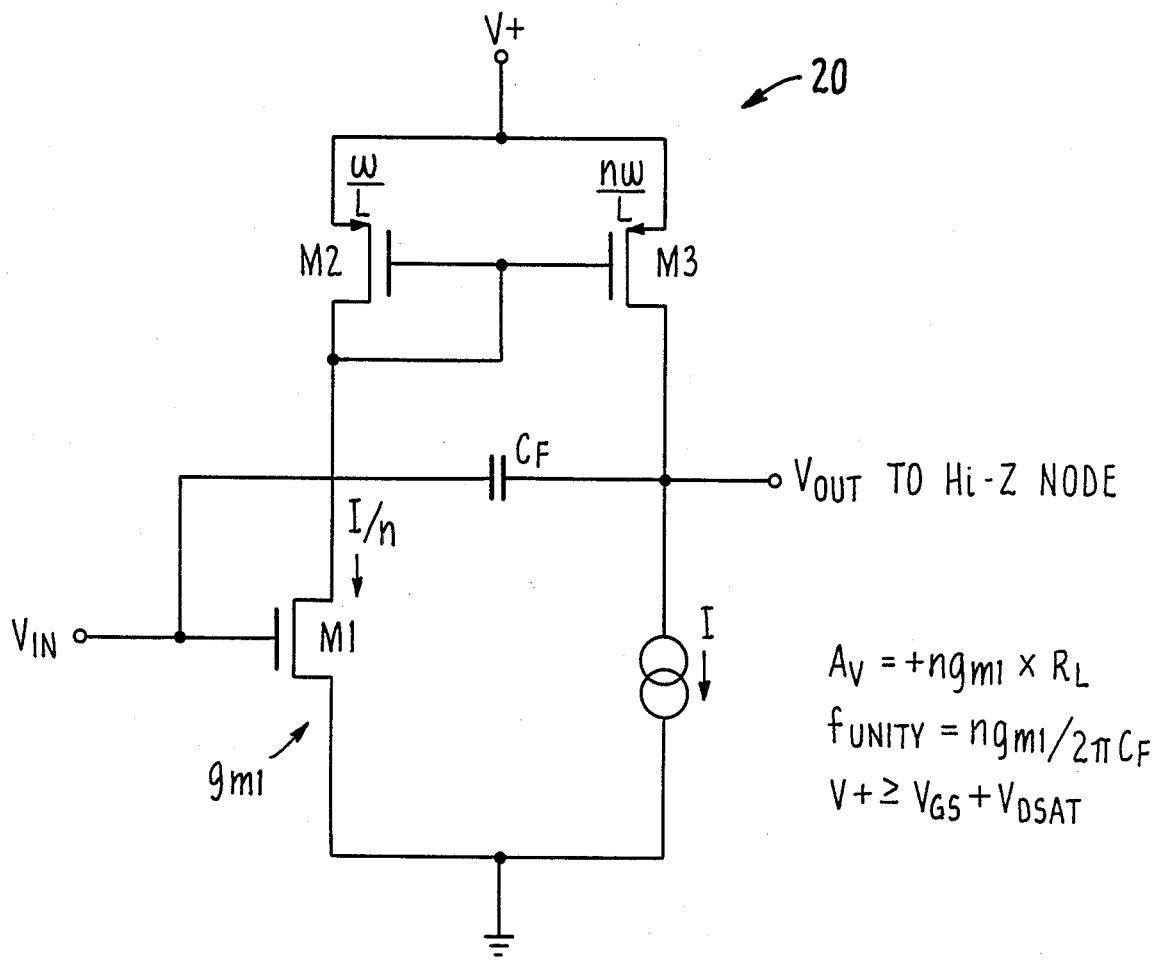
FIG. 4 is a schematic diagram illustrating one embodiment of a single-input, single-ended, feed-forward gain stage in accordance with the present invention.

FIG. 4 illustrates a simple schematic implementation of the concept shown in FIG. 3. In the embodiment of the invention shown in FIG. 4, a feed forward gain stage 20 receives a single-ended input $V_{IN}$. The input signal $V_{IN}$ is applied to the gate of an amplifying MOS transistor M1 having a conductance of $g_{m1}$. The source of transistor M1 is connected to ground while its drain is connected to the commonly-connected gates of current mirror transistors M2 and M3. The input signal $V_{IN}$ is also connected through the feed-forward capacitor $C_F$ to a Hi-Z (high impedance) output node. According to the standard current mirror configuration, the drain of transistor M2 is connected to the gates of transistors M2 and M3. This current mirror is not restricted to a gain of one; it can have any ratio, n. The drain of transistor M3 is connected to the Hi-Z node which is also connected to ground through current load I. The current in transistor M1 is set by I/n.

The circuit shown in FIG. 4, although very simple, can increase the gain of an operational amplifier by 40 db without introducing instability. At high frequencies, the input signal $V_{IN}$ is fed-forward to the Hi-Z node, i.e., the output of the non-inverting gain block. That is, the dc signal path is bypassed. The frequency at which this occurs, $Ng_{m1}/2\pi C_F$, is set to be lower than the unity gain frequency of the overall amplifier of which it is a part.

Operation of the circuit shown in FIG. 4 is down to $V_{gs}+V_{dsat}$, which can be as low as 1 V in CMOS processes with controlled pinch-off voltages or with bipolar processes. The output is capable of rail-to-rail swing, an important advantage in low voltage circuits.

Figure 5:
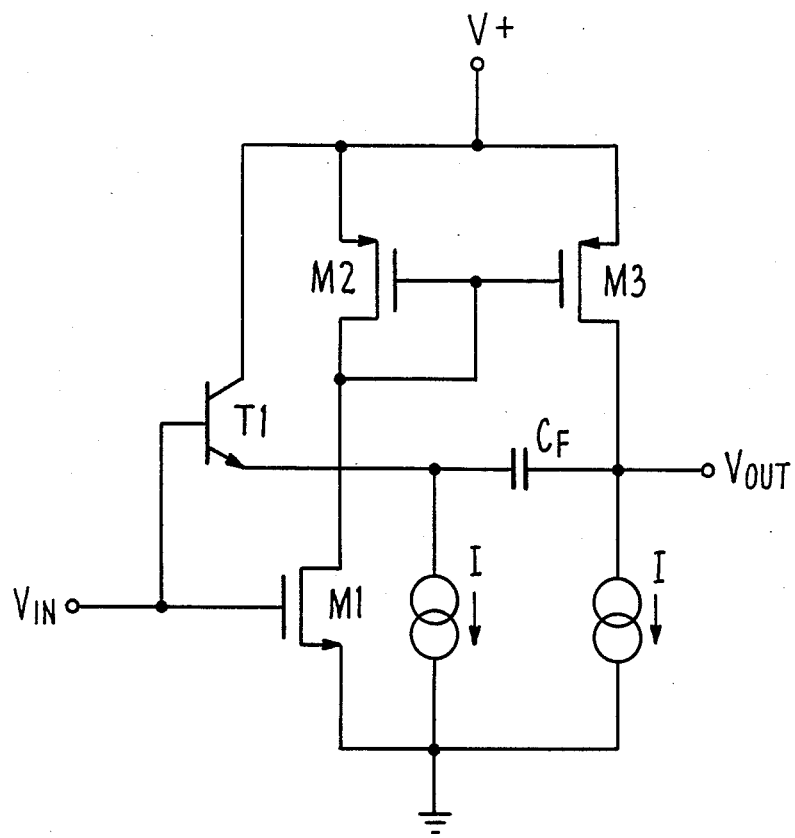
FIG. 5 is a schematic diagram illustrating a second embodiment of a single-input, single-ended, feed-foward gain stage in accordance with the present invention.

When driven from Hi-Z sources, it is often preferable to drive capacitor $C_F$ with a separate voltage follower. FIG. 5 illustrates a preferred embodiment of the invention which implements this feature. In CMOS, a bipolar transistor $T_1$, either NPN or PNP, is preferred because of its high transconductance; however, a MOS transistor can be used as well. Unidirectional device $T_1$ is dedicated to the task of driving capacitor $C_F$. If any signal from succeeding stages feeds back, it is stopped by device $T_1$.

Figure 6:
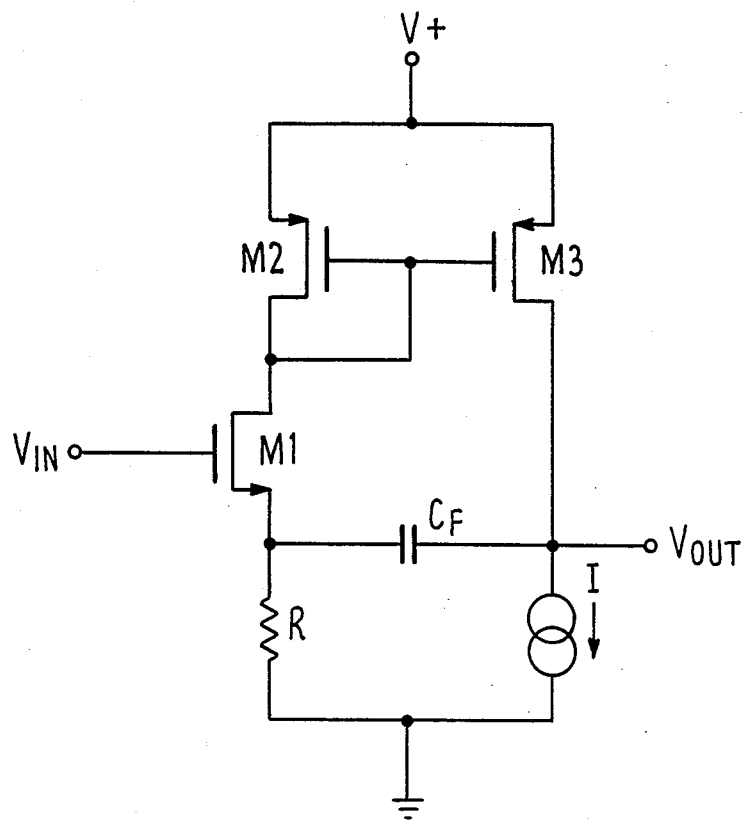
FIG. 6 is a third schematic diagram illustrating third embodiment of a single-input, single-ended, feed-forward, gain stage in accordance with the present invention.
Figure 7:
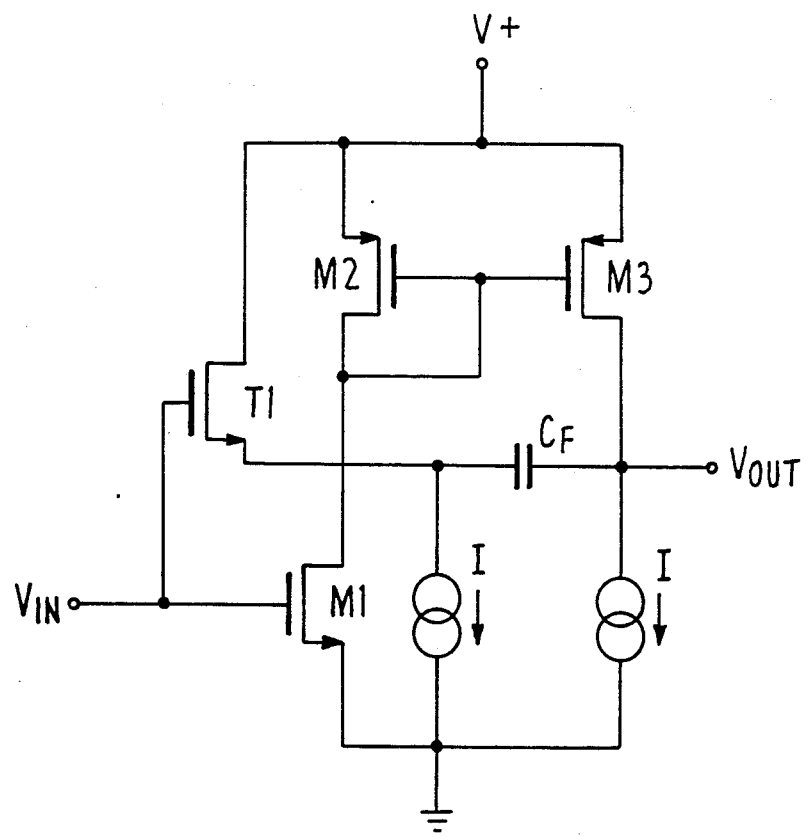
FIG. 7 is a schematic diagram illustrating a single-input, single-ended, feed-forward gain stage in accordance with the present invention which includes a voltage follower transistor.

Alternatively, as shown in FIG. 6, the feed-forward capacitor $C_F$ can be driven from the amplifier transistor M1 if the source (or emitter) of device M1 is isolated from ground using a degeneration resistor R.

Figure 8A:
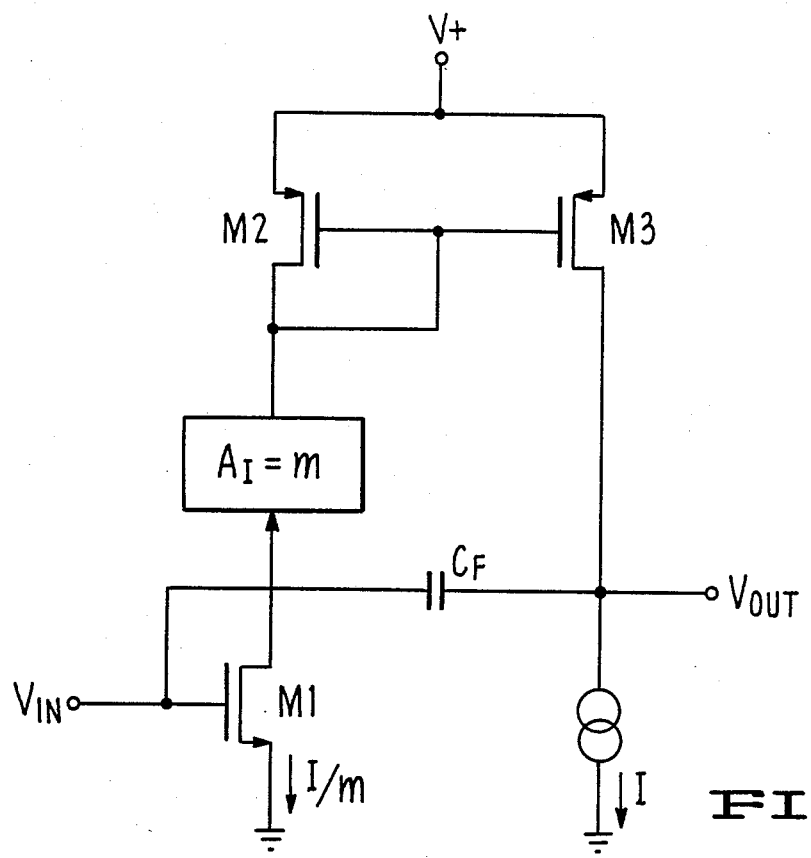
FIG. 8A is a schematic diagram illustrating a sixth alternative embodiment of a single-input, single-ended, feed-forward gain stage in accordance with the present invention.

FIG. 8A shows another MOS alternative embodiment of a non-inverting gain stage in accordancre with the present invention. In the circuit shown in FIG. 8A, the drain of the input MOS transistor M1 passes current through a current amplifier having gain m.

Figure 8B:
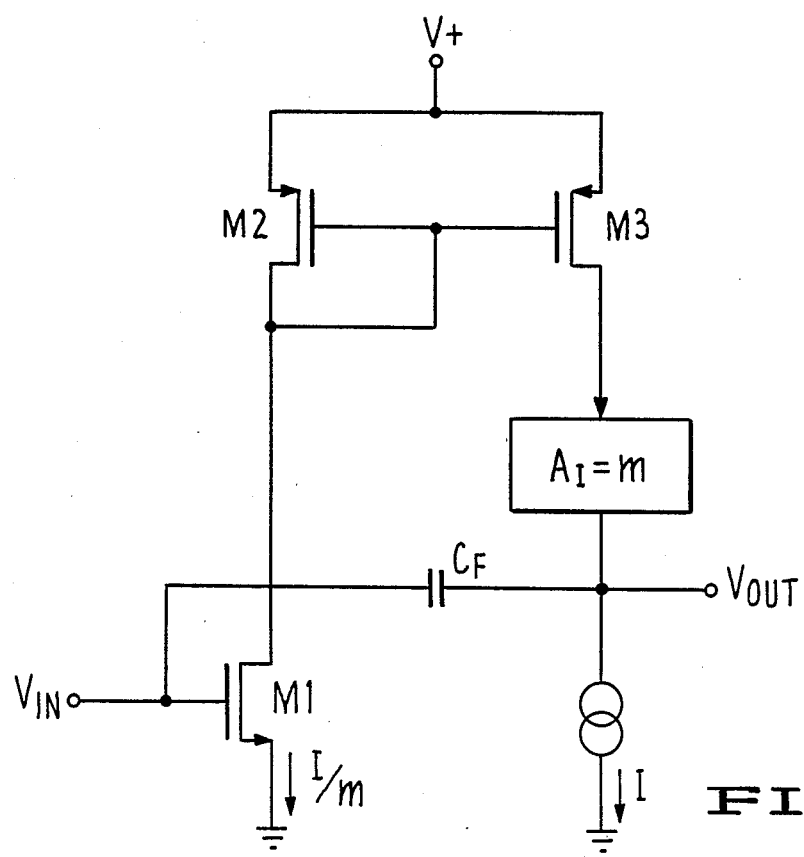
FIG. 8B is a schematic diagram illustrating a seventh alternative embodiment of a single-input, single-ended, feed-forward gain stage in accordance with the present invention.

FIG. 8B shows a variation of the FIG. 8A circuit wherein the output of the current mirror, i.e. the drain of transistor M3, passes current through a current amplifier having gain m.

It should be understood that various alternatives to the embodiments shown herein may be employed in practicing the present invention. It is intended that the following claims define the invention and that circuits within the scope of these claims and their equivalents be covered thereby.

What is claimed is:

1. A non-inverting gain stage of an operational amplifier wherein the non-inverting gain stage receives a single input and generates a single-ended output, the non-inverting gain stage comprising:

an amplifying MOS transistor having its gate connected to receive the input and its source connected to ground;

a current mirror comprising first and second MOS transistors, the commonly-connected gates of the first and second transistors being connected to the drain of the amplifying transistor, the drain of the first transistor also being connected to the gates of the first and second transistors, the commonly-connected sources of the first and second transistors being connected to a supply voltage, the drain of the second transistor being connected to a high impedance output node which is connected to ground through a current load; and a feed-forward capacitor having a first side connected to receive the input and a second side connected to the high impedance output node, the feed-forward capacitor being responsive to the input to feed-forward the input when the input frequency is greater than a preselected value.

2. A non-inverting gain stage as in claim 1 wherein the preselected value is lower than the unity gain frequency of the operational amplifier.

3. A non-inverting gain stage of an operational amplifier wherein the non-inverting gain stage receives a single input and generates a single-ended output, the non-inverting gain stage comprising:
   an amplifying MOS transistor having its gate connected to receive the input and its source connected to ground via a degeneration resistor;
   a current mirror comprising first and second MOS transistors, the commonly-connected gates of the first and second transistors being connected to the drain of the amplifying transistor, the drain of the first transistor being connected to the gates of the first and second transistors, the commonly-connected sources of the first and second transistors being connected to a supply voltage, the drain of the second transistors being connected to a high impedance output node which is connected to ground through a current load; and
   a feed-forward capacitor having a first side connected between the source of the amplifying transistor and the degeneration resistor and a second side connected to the high impedance output node, such that the feed-forward capacitor feeds-forward the signal from the source of the amplifying transistor to the high-impedance output node when the input frequency is greater than a preselected value.

4. A non-inverting gain stage as in claim 3 wherein the preselected value is lower than the unity gain frequency of the operational amplifier.

5. A non-inverting gain stage of an operational amplifier wherein the non-inverting gain stage receives a single input and generates a single-ended output via a dc signal path, the non-inverting gain stage comprising:
   an MOS transistor responsive to the input to amplify the input, the drain of the MOS transistor passing current through a current follower transistor;
   a current mirror responsive to the amplified input to provide a current output to a current source load, the current output being the drain current of a common-source transistor; and
   means for bypassing the dc signal path to feed-forward the input to the current source load when the input frequency is greater than a preselected value.

6. A non-inverting gain stage of an operational amplifier wherein the non-inverting gain stage receives a single input and generates a single-ended output via a dc signal path, the non-inverting gain stage comprising:
   an MOS transistor responsive to the input to amplify the input, the drain of the MOS transistor passing current through a current amplifier;
   a current mirror responsive to the amplified input to provide a current output to a current source load, the current output being the drain of a common-source transistor; and
   means for bypassing the dc signal path to feed-forward the input to the current source load when the input frequency is greater than a preselected value.

7. A non-inverting gain stage of an operational amplifier wherein the non-inverting gain stage receives a single input and generates a single-ended output via a dc signal path, the non-inverting gain stage comprising:
   means responsive to the input for amplifying the input;
   a current mirror responsive to the amplified input to provide a current output to a current source load through a current amplifier, the current output being the drain current of a common-source transistor; and
   means for bypassing the dc signal path to feed-forward the input to the current source load when the input frequency is greater than a preselected value.

8. A gain stage as in claim 5, 6 or 7 wherein the current mirror has a gain other than unity.

9. A non-inverting gain stage as in claim 5, 6 or 7 wherein the preselected value is lower than the unity gain frequency of the operational amplifier.

10. A non-inverting gain stage of an operational amplifier wherein the non-inverting gain stage receives a single input and generates a single-ended output, the non-inverting gain stage comprising:
    an amplifying N-channel MOS transistor having its gate connected to receive the input and its source connected to ground;
    a current mirror comprising first and second P-channel MOS transistors having commonly-connected gates and commonly-connected sources, the commonly-connected gates of the first and second transistors being connected to the drain of the amplifying transistor, the drain of the first transistor also being connected to the commonly-connected gates of the first and second transistors, the commonly-connected sources of the first and second transistors being connected to a supply voltage, the drain of the second transistor being connected to a high impedance output node which is connected to ground through a current load;
    a feed-forward capacitor having a first side connected to receive their input and a second side connected to the high impedance output node, the feed-forward capacitor being responsive to the input to feed-forward the input when the input frequency is greater than a preselected value; and
    a unidirectional voltage follower transistor connected between the input and the feed-forward capacitor to drive the feed-forward capacitor.

11. A non-inverting gain stage as in claim 10 wherein the voltage follower transistor is a bipolar transistor having its base connected to receive the input, its collector connected to the commonly-connected sources of the first and second current mirror transistors and its emitter connected to the first side of the feed-forward capacitor.

12. A non-inverting gain stage as in claim 10 wherein the voltage follower transistor is an MOS transistor having its gate connected to receive the input, its drain connected to the commonly-connected sources of the first and second current mirror transistors and its source connected to the first side of the feed forward capacitor.

* * * * *